United States Patent [19]

Lemons et al.

[11] 4,213,818
[45] Jul. 22, 1980

[54] SELECTIVE PLASMA VAPOR ETCHING PROCESS

[75] Inventors: Kyle E. Lemons, San Jose; Richard C. Blish, II, Los Gatos; Jan D. Reimer, Palo Alto, all of Calif.

[73] Assignee: Signetics Corporation, Sunnyvale, Calif.

[21] Appl. No.: 1,039

[22] Filed: Jan. 4, 1979

Related U.S. Application Data

[63] Continuation of Ser. No. 828,943, Aug. 29, 1977, abandoned.

[51] Int. Cl.² .................. H01L 21/306; C23F 1/02
[52] U.S. Cl. ............................ 156/643; 156/646; 156/653; 156/657; 156/345; 204/164; 204/192 E; 252/79.1
[58] Field of Search .......... 204/164, 192 E, 192 EC, 204/298; 156/643, 646, 653, 657, 662, 345, 659; 252/79.1; 250/531

[56] References Cited

U.S. PATENT DOCUMENTS

| | | | |
|---|---|---|---|
| 3,615,956 | 10/1971 | Irving et al. | 156/662 X |
| 3,679,502 | 7/1972 | Hays | 156/646 |
| 3,971,684 | 7/1976 | Muto | 204/192 E |

FOREIGN PATENT DOCUMENTS 5127833  3/1976  Japan ........................ 156/643

*Primary Examiner*—William A. Powell
*Attorney, Agent, or Firm*—Jerry A. Dinardo; Jack Oisher; Thomas A. Briody

[57] ABSTRACT

Selective plasma vapor etching process for performing operations on a solid body formed of at least two different materials capable of being vapor etched exposed at, at least, one surface of the body, with the body being disposed in a chamber having a partial vacuum therein. A gas plasma is created within the chamber to produce active species of atoms and molecules so that these species come into contact with the surface of the body to chemically react at least one of the materials with active species from the gas plasma to form a gas-nongaseous chemical reaction by controlling the concentration and reaction kinetics of specific species, and by controlling the activation energy of the etching reactions to produce a difference in rates between the materials so that the etching is more selective to one material over the other. The species is also controlled by the frequency of the electromagnetic energy.

14 Claims, 15 Drawing Figures

Diffusion mask formation or passivation layer

↓

Geometric pattern generation

↓

Plasma etching

↓

Plasma pattern removal

↓

Resume standard processing

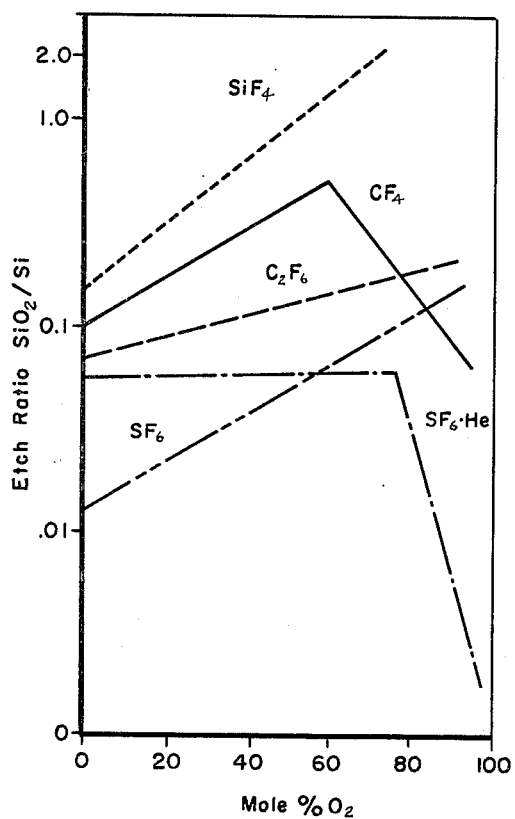
Fig. 13
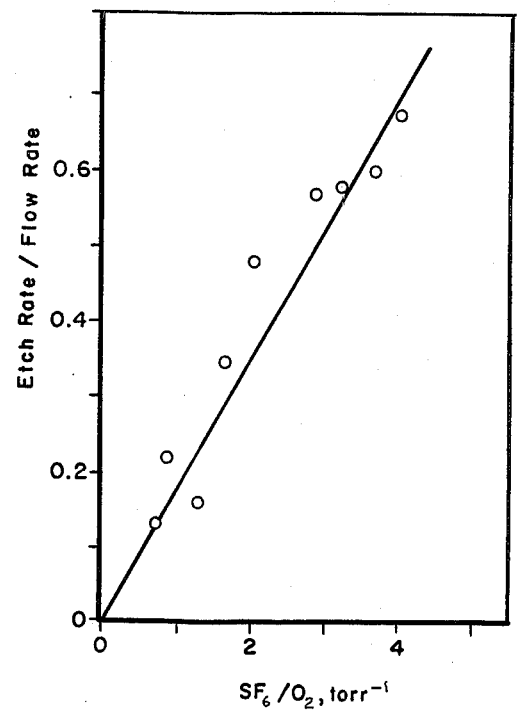
Fig. 15
Fig. 14
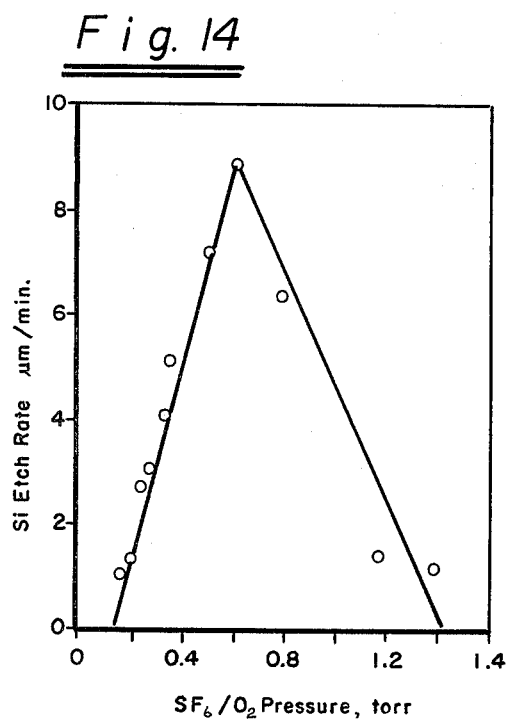

SELECTIVE PLASMA VAPOR ETCHING PROCESS

This is a continuation of application Ser. No. 828,943 filed Aug. 29, 1977, now abandoned.

BACKGROUND OF THE INVENTION

In U.S. Pat. No. 3,615,956 there is disclosed a gas plasma vapor etching process in which it is possible to perform operations on a wafer formed of a semiconductor material and having a surface capable of carrying at least one layer of at least one different material on the surface and disposed in a chamber having a pressure ranging from one-tenth to 10 mm mercury. Thus, plasma having active halogen species of atoms and molecules is created within a chamber so that the gas plasma comes into contact with the wafer to remove material from the wafer by chemically reacting the material with an active halogen species in the gas plasma to form a gas—non-gaseous chemical reaction which produces a halide compound. In the patent, it is disclosed that this process can be utilized for sequentially removing metal such as aluminum, for removing an insulating material such as silicon dioxide, and for removing silicon. There, however, is no disclosure in the patent as to how one of several materials which could react with the gas plasma could be selectively removed with reference to the other of the materials. There is a need for a selective vapor etching process which will make this possible.

SUMMARY OF THE INVENTION AND OBJECTS

The selective vapor etching process is utilized for performing operations on a solid body formed of at least two different materials capable of being vapor etched and being exposed at, at least, one surface. The body is disposed in a chamber having a vacuum therein. A gas plasma is created within the chamber to produce active species of atoms and molecules so that these species can come into contact with the surface of the body to chemically react at least one of the materials with active species in the gas to form a gas—non-gaseous chemical reaction. The rate of a chemical reaction is controlled so that a reaction can be made selective to one of said several different materials. In particular, the kinetics of the reaction can be controlled so that one of the materials can be removed substantially more rapidly than the other material as, for example, silicon dioxide can be made to etch more rapidly than silicon, or, conversely, silicon can be made to etch more rapidly so that they can be selectively removed one at a time.

In general, it is an object of the present invention to provide a selective vapor etching process which makes it possible to selectively remove one material more rapidly than others.

Another object of the invention is to provide a process of the above character in which the chemical kinetics of the chemical reaction utilized for the removal can be controlled so that either one of the two different materials can be removed at the rate which is fast relative to the rate of the removal of the other material.

Another object of the invention is to provide a process of the above character which is useful in which one of the two different materials is a metal or its oxide, or a metal compound in its higher oxidation state.

Another object of the invention is to provide dry, low temperature, cold wall, clean sequential etching in the same chamber.

Another object of the invention is to provide a process of the above character which is particularly useful in connection with the production of semiconductor devices.

Another object of the invention is to provide a process of the above character which makes it possible to substitute dry processes for wet processes in the manufacture of the semiconductor devices.

Another object of the invention is to provide a process of the above character in which complete semiconductor devices can be manufactured utilizing dry processes of the present invention.

Another object of the invention is to provide a process of the above character in which the different materials are formed in layers or other geometrical structures and in which differential etching of the layers can be obtained.

Another object of the invention is to provide a process of the above character which is compatible with any planar processing of semiconductor devices.

Another object of the invention is to provide a removal process of the above character which makes it possible to use only gases and vapors in the etching of the semiconductor devices.

Another object of the invention is to provide a process of the above character which requires a minimum of manual handling.

Another object of the invention is to provide a process of the above character in which isotropic or preferential etching behavior is attained.

Additional object and features of the invention will appear from the following description in which the preferred embodiment is set forth in detail in conjunction with the accompanying drawing.

BRIEF DESCRIPTION OF THE DRAWING

FIGS. 10-15 are graphs showing various characteristics and parameters of the present process.

DESCRIPTION OF THE PREFERRED EMBODIMENTS

Figure 1:
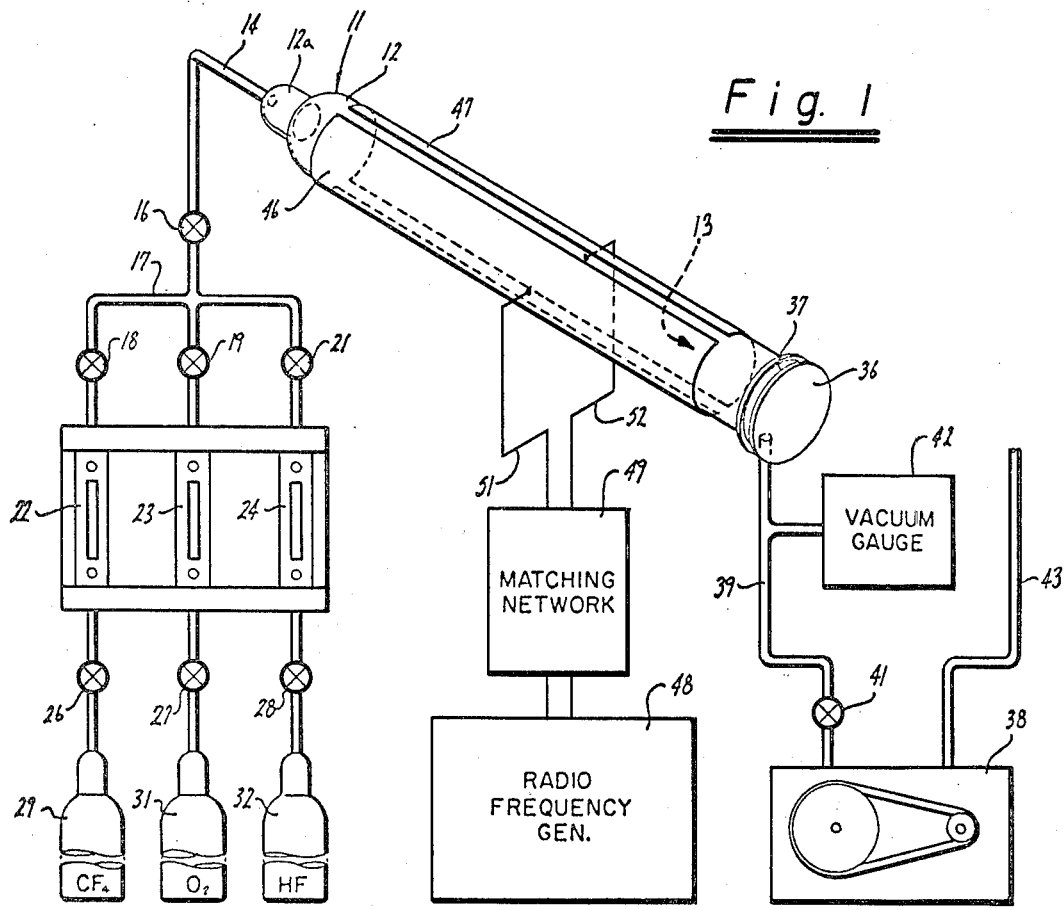
FIG. 1 is a schematic illustration of a radio frequency plasma apparatus and system which is utilized in performing the process incorporating the present invention.

A radio frequency plasma apparatus and system is shown in FIG. 1 of the drawing which can be utilized in performing the process of the present invention. The apparatus and system is of the type described in U.S. Pat. No. 3,615,956, and consists of a relatively large elongate reaction vessel 11 of a suitable type. For example, it can consist of a quartz tube 12 which is approximately 3 inches in diameter and 4 feet in length. The tube 12 is formed so as to provide therein a cylindrical reaction zone or chamber 13. One end of the tube is provided with a necked down portion 12a which serves as a gas inlet to the tube 12. A pipe 14 of suitable material such as stainless steel is connected to the gas inlet portion 12a and has a control valve 16 mounted thereon. The valve 16 is connected to a manifold 17 which has a plurality of valves 18, 19 and 21 connected therein and which are connected to flow meters 22, 23 and 24, respectively. The flow meters 22, 23 and 24 are connected through valves 26, 27 and 28 to suitable sources of gas indicated by the bottles 29, 31 and 32. These bottles contain suitable gases which are required for the processing operations hereinafter described. By way of example, they can contain $CF_4$, $O_2$ and HF as shown in the drawing. Solids and liquids can be used as vapor sources as well.

The other end of the tube 12 can be opened to permit loading and unloading of the tube. The open end of the tube 12 is closed by a flat plate 36 which carries an O-ring seal 37. Means is provided for continuously evacuating the chamber within the tube 12 and consists of a mechanical roughing pump 38 which is connected to the tube 12 by a line 39 which has a valve 41 therein. A vacuum gauge 42 is connected into the line 39 and measures the vacuum in the chamber 13. Typically, the pressure within the chamber 13 should be in the range from 0.1 to 10 Torr (mm of mercury). The vacuum pump 38 is provided with an exhaust line 43 which can exhaust into a hood (not shown) or into the ambient air.

Means is provided for creating an electromagnetic field within the reaction zone 13 and consists of a pair of elongate, substantially semi-circular plates 46 and 47 or, alternatively, coils, formed of a suitable conducting metal such as copper. As can be seen from the drawing, the plates have a length which is substantially as great as the length of the tube 12 but are insulated from each other by the fused silica tube 12. Radio frequency power is supplied to the two spaced plates 46 and 47 from a radio frequency generator 48 through a matching network 49 and through lines 51 and 52 to the plates 46 and 47. The radio frequency generator can be of any suitable type such as one which has a 300 watts output and generates a fixed radio frequency such as $13\frac{1}{2}$ magahertz. Matching network 49 can also be of a conventional type and serves to match the impedance of plates 46 and 47 which serve as electrodes to the radio frequency generator of power supply 48 to thereby obtain a maximum transfer of energy from the generator 48 to the gas within the reaction zone 13. Also, it should be understood that conventional, commercially available equipment can be used by adding an appropriate manifold for the various reagents inputs. It is further understood that other forms of electromagnetic energy may also be used to provide the same result.

Figure 2:
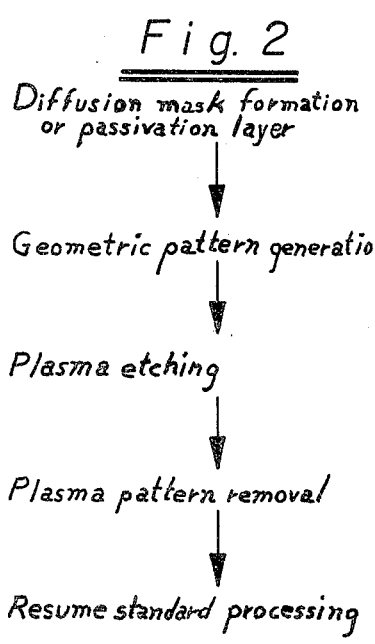
FIG. 2 is a flow diagram showing processing steps in the manufacture of semiconductor devices using vapor etching techniques of the present invention.
Figure 3:
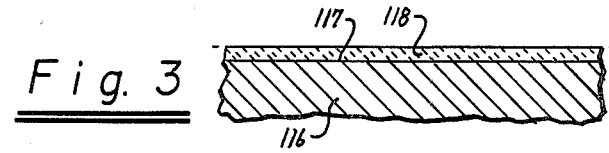
FIGS. 3-9 are cross-sectional views showing certain of the steps for the manufacture of semiconductor devices using vapor etching techniques of the present invention.
Figure 4:
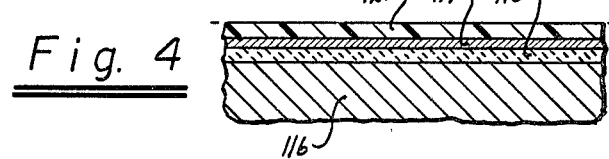
Figure 5:
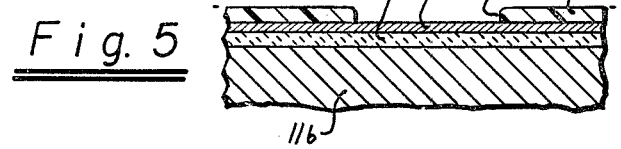
Figure 6:
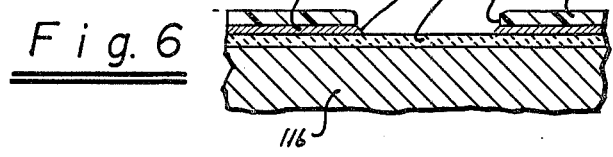
Figure 7:
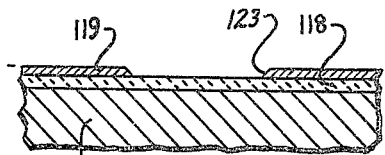

In FIG. 2, there is shown a flow diagram of the non-liquid RF plasma etching process in which the vapor etching utilized incorporates the present invention.

By way of example, the present invention can be described in conjunction with two conventional semiconductor device manufacturing processes, each of which uses 7 masks set forth below.

| Mask No. | Bipolar Operation |
|---|---|
| 0 | buried layer diffusion (+ epi) |
| 1 | isolation diffusion |
| 2 | base diffusion |
| 3 | emitter/collector diffusion |
| 4 | contacts |
| 5 | Al metallization |
| 6 | glassivation |
| | Poly Si gate MOS |

-continued

| | |
|---|---|
| 1 | field inversion diffusion |
| 2 | complement. #1 for gate oxide and poly Si |
| 3 | source/drain diffusion |
| 4A | poly Si interconnect |
| 4B | contacts |
| 5 | Al metallization |
| 6 | glassivation |

The 7 masking operations for each type of device shown above can be performed in a single module. In order to complete a semiconductor device, the semiconductor slice or wafer could be recycled through the module 7 different times for all the operations required. Alternatively, 7 different modules could be provided so that semiconductor bodies or wafers could be continuously processed throughout all of the masking operations required.

A typical set of steps which would be utilized for one of the masks in making a semiconductor device is shown in FIGS. 3-9.

In describing the process, let it be assumed that the process is carried out by performing operations on a solid body formed of at least two different materials capable of being vapor etched which are exposed at one surface of the body. By way of example, let it be assumed that the body is in the form of a semiconductor wafer 116 having a diameter which can range from $1\frac{1}{2}$ to 3 inches or more and which is provided with a planar upper surface 117. The semiconductor can be of any suitable type such as silicon which has a P or N type impurity therein. By way of example, for a typical integrated circuit, the semiconductor body or wafer 116 could have a P type impurity with a resistivity of 6 to 9 ohm cm.

Now let it be assumed that the wafer 116 is being processed in accordance with the present invention and that it is desired to utilize the next mask in the process. As is well known to those skilled in the art, a number of operations could previously have been carried out in the semiconductor body or wafer 116. Thus, for example, a buried layer could have been provided as well as an epitaxial layer. Isolation diffusion, base diffusion and so forth could have been carried out so that there would be provided P-N junctions within the semiconductor body which are generally dish-shaped and extend to the surface to form a part of the semiconductor device. Let it be assumed that a diffusion operation has been carried out and an oxide remains on the surface 117 or has been stripped from the surface 117, and thereafter, an oxide layer 118 is grown on the surface 117 in a conventional manner (see FIG. 3) such as by placing the same in an oxidizing atmosphere in a diffusion furnace until it has grown to the desired thickness to serve as a diffusion mask as is well known to those skilled in the art.

In order to provide a pattern on the wafer, a mask for the plasma or vapor etching hereinafter described is produced by applying a photoresist layer 121 and exposing this to ultraviolet radiation, developing, rinsing and drying, as is well known to those skilled in the art. Suitable activated species are then used to etch the exposed surface through the patterned photoresist to a predetermined depth through one layer, e.g. $SiO_2$, to the silicon substrate. The selectivity is such that the mask is not consumed before sufficient etching has occurred so that the etching does not proceed significantly beyond the interface if so desired. Different activated species can then be produced in the chamber cavity to etch another layer through the mask, or the mask can be removed by the activated gas. In addition to the photoresist layer 118, other mask materials may be used, such as evaporated metals, as shown by metal layer 119. The chamber 13 is purged and a new gas is metered into the chamber 13. Oxygen ($O_2$) plus a suitable catalyst such as a halide compound or a similar gas is then metered into the reaction chamber 13 which again causes a gas plasma to be formed in which the active species of the molecules and atoms will attack the photoresist and cause the formation of volatile compounds ($CO_2 + CO + H_2O$) which also would be evacuated through the roughing pump 38. This leaves a metal field which has openings 123 therein covering the silicon dioxide layer 118.

New gases are then introduced into the reaction chamber 13 which will cause the silicon dioxide layer 118 to be etched much more rapidly than the silicon body 116 or the metal layer 119.

As the gas passes into the field created by the plates 46 and 47, the radio frequency energy excites the gas and initiates a breakdown in the gas which causes energy to be coupled into the gas and to create what is called a glow discharge. It is believed that this glow discharge is comprised of a complicated non-equilibrium low temperature plasma which is highly reactive because it consists of atoms and molecules and free radicals, both neutral and ionized, in ground and excited states which are capable of contributing to a reaction process. In any event, the gas contains active species of atoms and molecules which cause a gas-solid or gas-non-gas reaction with the solids which are exposed to the gas.

In connection with the present invention, it has been found that there are several reagents which are capable of providing selective etching in various systems. For example, silicon tetrafluoride ($SiF_4$), carbon tetrafluoride ($CF_4$), sulfur hexafluoride ($SF_6$), sulfur oxyfluoride ($SO_2F_2$), perfluoropropane ($C_3F_8$), and any of these gases mixed with oxygen, oxygen plus nitrogen, other oxidizing species, or other reducing species.

It should be appreciated in conjunction with the foregoing that although a metal mask is employed, other materials as well as photoresist by itself can be a suitable mask. This is desirable because it eliminates one etch step.

Figure 8:
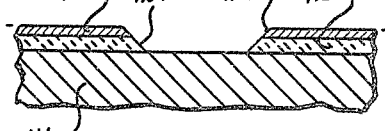

The gas plasma removes the exposed areas of silicon dioxide layer 118 at a rapid rate, FIG. 8. As soon as this has been accomplished, only the silicon and metal are exposed and neither one of these will etch very rapidly when the proper gases are selected to cause rapid etching of the silicon dioxide to form windows 124.

Figure 9:
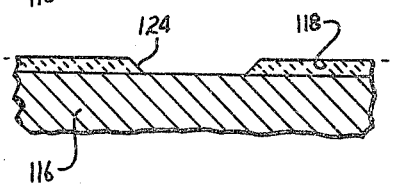

As soon as the exposed silicon dioxide has been removed, the reaction chamber 13 is again purged and a suitable gas is introduced to form a gas plasma which will remove the exposed metal layer 119 so that all that remains is the silicon dioxide layer 118 with the openings 124 therein as shown in FIG. 9.

The plasma etching of the silicon dioxide in addition to being a dry process has an additional advantage. As is well known to those skilled in the art, liquid etching is sometimes sensitive to grain boundaries, crystal orientation and surface energy effects. Semiconductor device planar surfaces are sometimes modified to make photoresist adhere well. This can lead to edge profiles which are desirable (as in the case of crystallographically controlled grooves produced in <100> silicon by etching in KOH/Alcohol), or undesirable profiles such as vertically steep silicon oxide steps or poly-crystalline silicon steps which are difficult to cover continuously during subsequent deposition steps. It has been found that the excited species in the gas plasma which are utilized in conjunction with the present invention can be desensitized to such influences and, therefore, isotropic behavior is attained during the etching operations. This leads to edge profiles of approximately 45° for uniform layers. Different slopes can be obtained in graded layers by control of the fast lateral etch rate of the deeper portion of the layer as described in U.S. Pat. No. 3,842,490 issued Oct. 22, 1974.

From the foregoing, it can be seen that it has been found that the interaction of an RF electrodeless glow discharge gas plasma and etching of a solid can be made selective to one material versus another where both can be vapor etched by appropriate control of the chemical kinetics which includes stoichiometry, concentration, power density, pressure, flow rate and oxidizing/reducing environment. A suitable gas plasma composed of active species, such as oxy-halides, can be made to etch silicon and/or silicon dioxide using a suitable mask such as metal or photoresist. The mask is only slowly consumed under proper conditions when etching silicon using silicon dioxide as a mask or as a stop. As pointed out above, the excited chemical species produced in such an environment are highly reactive so edge profiles are always sloped gradually depending on the etch rate versus depth into multiple or graded layers. As is well known to those skilled in the art, rounded edges are of value forming continuous layers on semiconductor wafers.

It has been found that the kinetics of the low temperature electrodeless RF glow discharge selective etching follows the same fundamental laws, namely, an activity (monitored by etch rate) which is proportional to concentration (flow rate) in a dynamic system and inversely proportional to pressure which corresponds to the specific excitation of the molecules or radicals. This finding has been checked for several gas mixtures by plotting etch rate/flow rate (to remove the concentration effect) versus inverse pressure, noting that all data follows one straight line with a zero intercept. (See FIG. 15). The optimum pressure, where reaction rate is dominated by neither limited concentration nor limited excitation, is determined for each individual reactor system.

Figure 10:
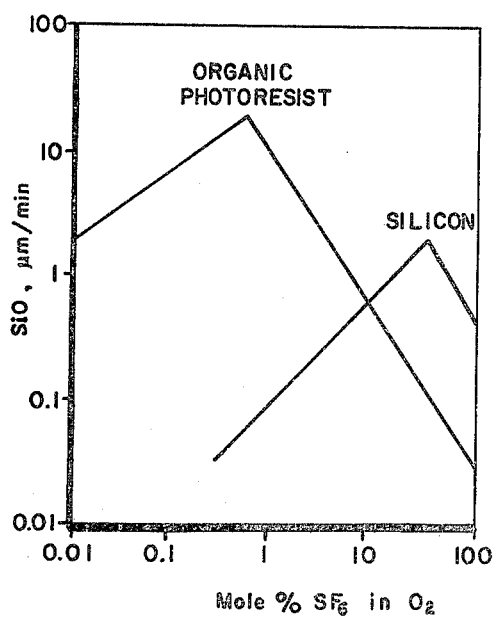

FIG. 10 illustrates how control of gas composition produces selectivity of a plasma reaction of silicon versus organic photoresist in $SF_6/O_2$ mixtures. From the graph, a mixture of 30% $SF_6$ and 70% $O_2$ is capable of removing silicon about 20 times more rapidly than the photoresist. In contrast, an addition of only 0.4% $SF_6$ to $O_2$ has the effect of enhancing the photoresist removal rate, while simultaneously suppressing the silicon etch rate to yield an etch ratio of 400:1, versus 1:20 for the first reaction.

Figure 11:
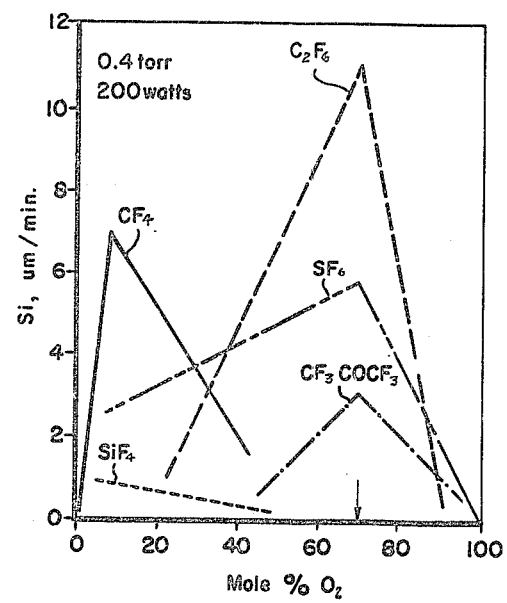

FIG. 11 shows the etch rate of silicon versus the mole percent of oxygen in a number of different halogenated gases. $C_2F_6$, $SF_6$ and $CF_3COCF_3$ have the maximum etch rates on silicon when approximately 70% of oxygen is added. The stoichiometric point of halide and oxygen is determined by an appropriate chemical equation. These gases follow a definite, natural chemical formula of reacting in a manner with the silicon to produce silicon oxy-fluoride ($SiOF_2$) species.

Thus, it can be seen that FIG. 11 generally establishes that there is a definite stoichiometric chemical reaction undergoing in the plasma—a reaction between silicon and these various halogenated compounds. The maximum etch rates occur at the halide/oxygen mole percentages for which an oxyfluoride and carbon monoxide are produced. For example, one chemical equation which follows definite chemical stoichiometry is set forth below:

$$C_2F_6 + 3 Si + 2\tfrac{1}{2} O_2 \rightarrow 3 SiOF_2 + CO$$

These are all in molar quantities. For a number of gases, the halide/oxygen mole ratios seem to hold.

Figure 12:
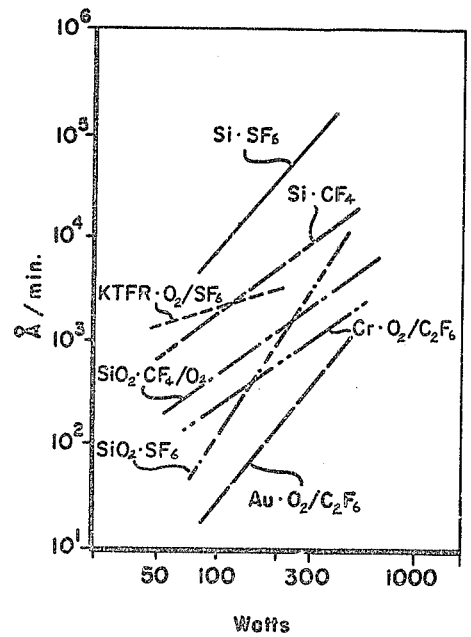

FIG. 12 is a plot of the etch rate of various materials versus the power (in watts) of the plasma. These are all straight lines with, however, different slopes. FIG. 12 establishes the fact that the reaction rate is related to the power put into the plasma in a power law fashion. From the curve for the reaction of silicon with sulfur hexafluoride ($SF_6$), it can be seen that the slope is steep and the actual etch rate is very high, i.e., as much as $10^5$ Angstroms per minute at 300 watts. One of the curves in FIG. 12 shows silicon etched with carbon tetrafluoride. Still another curve shows KTFR etched with oxygen and $SF_6$. The curves also show silicon dioxide etched in $SF_6$; silicon dioxide with $CF_4$ and oxygen; chromium with oxygen and $C_2F_6$; and gold etched with oxygen and $C_2F_6$.

FIG. 13 is a graph showing the etch ratio between silicon dioxide and silicon which gives specificity of one material over another or one layer over another in the same solid system. This is plotted against mole percent of oxygen and various halogenated compounds. As can be seen by way of example, a 20% silicon tetrafluoride ($SiF_4$), 80% oxygen mixture gives a 2:1 etch ratio of silicon dioxide ($SiO_2$) over silicon. $SF_6$ diluted with helium gives a constant etch ratio of the two materials up to almost 80% helium and then the ratio of the two drops very rapidly until $SiO_2$ is etched one thousand times slower than silicon. In other words, there is almost no etching of silicon dioxide with substantial etching of silicon.

For example, if one wanted to etch silicon dioxide rapidly and silicon very slowly as in opening up a diffusion mask, one would take silicon tetrafluoride, dilute it to about 80% oxygen and that would give you twice the etch rate of silicon dioxide to silicon so that it would be very easy to stop at the silicon-silicon dioxide interface. If, on the other hand, one wanted to etch silicon more rapidly than silicon dioxide, one would pick sulfur hexafluoride ($SF_6$) in helium so that the silicon dioxide would be etched very slowly in comparison to silicon.

From FIG. 13 it can be seen that silicon dioxide can be removed at a rate comparable to silicon when large molar percent $O_2$ is added to $CF_4$ and $SiF_4$. The optimum molar percent of $O_2$ in $CF_4$ for the largest etch ratio of $SiO_2$ to Si occurs at the stoichiometry which maximizes the production of oxygen difluoride ($OF_2$). It is believed that the bond lengths and angles of $OF_2$ (gas) are well matched to bridge the Si—Si bond and the Si—O bonds and that the effluent is volatile $SiOF_2$.

The selectivity for $SiO_2$ over Si is attained because of the strong oxidizing ambient, while reducing conditions favor the Si. The mixtures which yield maximum quantities of $OF_2$ stoichiometrically also coincide with the maximum Si etch rate for $SF_6$, $C_2F_6$, $CF_3$ and $CF_3COCF_3$.

From the foregoing information, it can be seen that greater ratios of etch rates can be obtained for greater percentages of oxygen. However, the absolute or actual etch rate decreases rapidly for large percentages of oxygen. The principal feature is to determine the etch rate as a function of percentage of the various gases and then comparing the peaks, i.e., looking at the maxima and minima in the curves to make it possible to ascertain the gas phase kinetics that are taking place. By dividing one curve by another, it is possible to develop a ratio which is a measure of the selectivity of the gas plasma for one material relative to another.

FIG. 14 is a graph of silicon etch rate versus pressure of $SF_6/O_2$, plotted as Torr. The pressure of the reactant is varied in the chamber and the etch rate is measured as a function of pressure. The graph shows a maximum etch rate of about 9 microns per minute at a pressure of 0.6 Torr at a power of 200 watts. This maximum is related to the fact that at low pressure all of the material is fully activated and is being used up in the chamber, as it is concentration limited. At high pressure, there is a power limitation in that there is more material than can be fully activated by the power. The curve falls off sharply for that reason above a pressure of more than approximately 0.6 Torr and there are less excited species. For the particular pressure of approximately 0.6 Torr, as many active species as possible are being coupled by the amount of power.

FIG. 15 is a graph which gives a plot of the same data as in FIG. 14 but the etch rate (R) divided by the flow rate is plotted versus the reciprocal of the pressure ($Torr^{-1}$). This gives an approximately straight line with a zero intercept in accordance with the theoretical equation of rate and power and concentration for a plasma system at 200 watts. The reactions are not empirical but follow definite natural laws which can be expressed in a single mathematical equation.

The basic plasma equation as determined in FIGS. 14 and 15 is $R = k(E/p)f$ where R, the etch rate is equal to a proportionality constant k times the electric field E over the pressure p times the flow rate f. If this is replotted as $R/f = kE \times 1/p$ as in FIG. 15, the plot does indeed pass through zero and is linear with a slope kE. FIG. 15 establishes that the data follows the law of the basic plasma equation.

It is well known to those skilled in the art that the activity of a d.c. plasma is proportional to the electric field and inversely proportional to the pressure or density of the mass. In the case of RF electrodeless plasmas, the same general criteria hold true because the RF frequency is far below the resonant frequency of the electrons.

To describe the application of the above principles, certain of the processing steps for the bipolar and polysilicon gate MOS devices will be explained utilizing a conventional process and the present RF plasma process to emphasize the advantages of the RF plasma process. In comparing the two processes, consideration is given to counting the required manual handling steps.

By way of example, let us consider producing the etched pattern in a silicon dioxide mask. This is a requirement in integrated circuit processing at all levels except aluminum in both bipolar and polysilicon gate MOS devices and polysilicon. In the conventional process after the patterned resist there are five manual (handling) steps which are as follows:

Conventional Process (0) patterned photoresist
(1) etch silicon dioxide in buffered HF (2) rinse in deionized water
(3) rinse in solvent or dry
(4) remove photoresist
(5) rinse in deionized water
(6) dry

RF Plasma Process (0) patterned photoresist
(1) etch silicon dioxide in an $SiF_4+O_2$ plasma, strip photoresist in $O_2$ plasma From the foregoing, it can be seen that in the RF plasma process there is one manual handling of the wafer in contrast to six for the conventional process. By way of example, the overlying photoresist had a thickness of 7000 Angstroms, the silicon dioxide or glass had a thickness of 10,000 Angstroms, the aluminum therebelow had a thickness of 10,000 Angstroms and the silicon dioxide layer below the aluminum pad had a thickness of approximately 10,000 Angstroms.

For the polysilicon gate MOS process, the steps in the conventional process are as follows:

Conventional Process (0) patterned photoresist
(1) etch silicon dioxide in buffered HF
(2) rinse in deionized water
(3) dry
(4) remove photoresist
(5) rinse in deionized water
(6) dry

RF Plasma Process (0) patterned photoresist
(1) utilize 40% $SiF_4$ or 40% $CF_4+60\%$ $O_2$ to etch silicon dioxide layer and then use $O_2$ plasma to remove photoresist.

Thus, it can be seen that there is one step requiring manual handling in the RF plasma process in comparison to the five steps in the conventional process.

Another example is provided by the third mask in the fabrication of polycrystalline silicon gate MOS devices, in which the silicon body has a top layer of masking oxide of approximately 1000 Angstroms in thickness to facilitate chemical etching of the underlying layer of polycrystalline silicon approximately 5000 Angstroms in thickness, in turn overlying the gate oxide of approximately 1000 Angstroms. Following is an example of the steps utilizing the third mask with the conventional process:

Conventional Process (1) oxidize polysilicon
(0) patterned photoresist
(2) etch masking oxide in buffered HF
(3) rinse in deionized water
(4) remove photoresist
(5) rinse in deionized water
(6) etch polycrystalline silicon
(7) rinse in deionized water
(8) etch silicon dioxide gate in buffered HF for gate oxide
(9) rinse in deionized water
(10) dry In the RF plasma etch process, the silicon body would have a gate oxide of 1000 Angstroms in thickness on the same with a layer of polycrystalline silicon of approximately 5000 Angstroms thickness over the gate oxide and a layer of photoresist having a thickness of approximately 7000 Angstroms over the polycrystalline silicon. The masking oxide is not needed.

Plasma Etch Process (0) patterned photoresist
(1) etch polycrystalline silicon in $SF_6+O_2$ using the photoresist as a mask, thereafter utilizing a nearly 100% oxygen plasma to strip the photoresist and thereafter using $SiF_4+O_2$ to remove the gate oxide utilizing the silicon as a mask From the foregoing, it can be seen that one manual handling step in the RF plasma process replaces ten manual steps for the conventional process and, in addition, produces a much better edge profile.

Alternatively, rather than utilizing an organic photoresist and an etchant to form windows in the silicon dioxide layer 118, it is possible to damage certain portions of the insulating layer 118 or metal layer 119 by suitable means such as by the use of electrons or ultraviolet light which would cause preferential etching of those portions of the layer which had been damaged. Thus, the damaged portion will be removed more rapidly than the undamaged portion to provide the windows in the desired locations and thus eliminating the organic photoresist and etching step which have conventionally been used.

As hereinbefore disclosed, the principal thrust of the present invention has been directed toward the selective plasma etching of materials utilized in the fabrication of semiconductor devices. However, it should be appreciated that the basic concept of selective plasma etching of materials has a much broader application. For example, the present invention can be utilized in any application in which metals and metal oxides are present. The metal can be selectively etched by the use of an oxygen plasma with a catalyst and the metal oxide can be selectively etched by an oxy-halide plasma. Metals to which the present invention are applicable are Groups IB, IIIA, IVA and IVB, VIB, VIII, such as aluminum, tin, platinum, titanium, molybdenum, and chromium as well as the oxides of these metals. Other metal oxides such as silicon dioxide ($SiO_2$), boron oxide ($B_2O_3$) and phosphorous oxide ($P_2O_5$) as well as glass. In addition, the invention is also applicable to compounds of metals in their higher oxidation states such as silicon nitride ($Si_3N_4$).

From the foregoing, it can be seen that there has been provided a greatly improved process for control of the gas plasma environment which makes it possible to selectively remove one of several different materials by controlling the parameters of the process and to control the relative rates of removal of the several materials. As explained hereinbefore, this is particularly advantageous in the fabrication of semiconductor devices in that it makes it possible to utilize a dry process for many, if not all, of the processing steps required for the manufacture of the semiconductor devices. It is readily apparent that this makes feasible continuous processing for the production of semiconductor devices either by the utiliziation of separate modules through which the devices pass during the separate processing steps or, alternatively, by recycling the semiconductor devices through the same module to carry out the desired number of operations.

It also can be seen that the present process which utilizes selective plasma etching of holes through a mask can thus be combined with RF plasma oxidation of organic photoresist to produce a fabrication process in which all operations can be accomplished with the use of gases of vapors exclusively. Therefore, a wafer transport system which does not require handling by operators can be readily envisioned which includes passage through diffusion furnaces or apparatus utilizing other doping techiniques such as by ion implantation, mask application or projection of the pattern in the RF plasma station where etching and mask disposal are performed.

What is claimed is:

1. In a selective vapor etching process for performing operations on a body formed of at least two different materials which are exposed at one surface of the body and in which the body is disposed in a chamber having a pressure below atmosphere therein, creating by electrodeless electromagnetic discharge within the chamber a gas plasma having active species of atoms and molecules, and wherein said gas plasma consists essentially of a binary mixture of 5 to 95 mole percent sulfur hexafluoride and the balance helium, so that the gas plasma comes into contact with the surface of the body to chemically react at least one of the materials with an active species in the gas plasma to form a gas-non-gaseous chemical reaction, and controlling the chemical kinetics of the reaction so that the reaction can be made selective to one of said two different materials.

2. The invention according to claim 1 wherein said gas plasma is used to preferentially etch silicon with respect to silicon dioxide.

3. The invention according to claim 1, wherein helium is present at less than 80 mole percent, to provide an etch ratio of $SiO_2$ to Si of about 0.1

4. The invention according to claim 1, wherein helium is present in the range of 80 to 95 mole percent to provide an etch ratio of $SiO_2$ to Si which decreases from 0.1 to 0.001 with increasing helium content.

5. In a selective vapor etching process for performing operations on a body formed of at least two different materials which are exposed at one surface of the body and in which the body is disposed in a chamber having a pressure below atmosphere therein, creating within the chamber a gas plasma having active species of atoms and molecules, and wherein said gas plasma consists essentially of a binary mixture of sulfur hexafluoride and oxygen, so that the gas plasma comes into contact with the surface of the body to chemically react at least one of the materials with an active species in the gas plasma to form a gas–non-gaseous chemical reaction, and controlling the chemical kinetics of the reaction so that the reaction can be made selective to one of said two different materials.

6. The invention according to claim 5 wherein a gas plasma of over 10% sulfur hexafluoride and the balance oxygen is used to preferentially etch silicon with respect to organic photoresist.

7. The invention according to claim 5 wherein a gas plasma of less than 10% sulfur hexafluoride and the balance oxygen is used to preferentially etch organic photoresist with respect to silicon.

8. The invention according to claim 5 wherein said gas plasma is used to preferentially etch silicon with respect to silicon dioxide.

9. The invention according to claim 5 wherein said gas plasma is maintained at a pressure substantially between 0.4 to 0.8 Torr for maximum etch rate of silicon.

10. The invention according to claim 9 wherein said gas pressure is about 0.6 Torr.

11. In a selective vapor etching process for performing operations on a body formed of at least two different materials which are exposed at one surface of the body and in which the body is disposed in a chamber having a pressure below atmosphere therein, creating within the chamber a gas plasma having active species of atoms and molecules and consisting essentially of a binary mixture of silicon tetrafluoride and an oxidizing species so that the gas plasma comes into contact with the surface of the body to chemically react at least one of the materials with an active species in the gas plasma to form a gas–non-gaseous chemical reaction, and controlling the chemical kinetics of the reaction so that the reaction can be made selective to one of said two different materials.

12. The invention according to claim 11 wherein said plasma consists essentially of a binary mixture of silicon tetrafluoride and oxygen.

13. The invention according to claim 12 wherein said gas plasma is used to preferentially etch silicon dioxide with respect to silicon.

14. The invention according to claim 13 wherein said gas plasma consists essentially of over 60% oxygen and the balance silicon tetrafluoride.

* * * * *